US010777407B2

(12) United States Patent
Smith et al.

(10) Patent No.: US 10,777,407 B2
(45) Date of Patent: *Sep. 15, 2020

(54) SELECTIVE DEPOSITION OF SILICON NITRIDE ON SILICON OXIDE USING CATALYTIC CONTROL

(71) Applicant: Lam Research Corporation, Fremont, CA (US)

(72) Inventors: David Charles Smith, Lake Oswego, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/247,296

(22) Filed: Jan. 14, 2019

(65) Prior Publication Data
US 2019/0148128 A1    May 16, 2019

Related U.S. Application Data

(63) Continuation of application No. 15/453,815, filed on Mar. 8, 2017, now Pat. No. 10,242,866.

(51) Int. Cl.
*H01L 21/02* (2006.01)
(52) U.S. Cl.
CPC ...... *H01L 21/0217* (2013.01); *H01L 21/0228* (2013.01); *H01L 21/02211* (2013.01);
(Continued)
(58) Field of Classification Search
CPC combination set(s) only.
See application file for complete search history.

(56) References Cited

U.S. PATENT DOCUMENTS 4,539,061 A  9/1985 Sagiv
6,423,582 B1  7/2002 Fischer et al.
(Continued)

FOREIGN PATENT DOCUMENTS

JP  2013-079447 A  5/2013
KR  10-2017-0016310 A  2/2017
(Continued)

OTHER PUBLICATIONS

U.S. Office Action, dated Nov. 16, 2017, issued in U.S. Appl. No. 15/432,634.
(Continued)

*Primary Examiner* — Mohammad M Choudhry
(74) *Attorney, Agent, or Firm* — Weaver Austin Villeneuve & Sampson LLP

(57) ABSTRACT

Methods and apparatuses for selectively depositing silicon nitride on exposed surfaces of a substrate having hydroxyl end groups relative to exposed surfaces having S—H bonds are provided herein. Techniques involve providing a transition metal-containing reactant or a non-hydride aluminum-containing gas to the substrate to form a transition metal-containing or an aluminum-containing moiety on an exposed surface having hydroxyl end groups and selectively depositing silicon nitride on the surface using alternating pulses of an aminosilane and a hydrazine by thermal atomic layer deposition catalyzed by the transition metal-containing or aluminum-containing moiety on the exposed surface having hydroxyl end groups relative to an exposed surface having S—H bonds. Additional techniques involve providing a transition metal-containing gas to an exposed silicon oxide surface to form a transition metal-containing moiety that acts as a catalyst during thermal atomic layer deposition of silicon nitride using alternating pulses of an aminosilane and a hydrazine.

19 Claims, 7 Drawing Sheets

(52) U.S. Cl.
CPC .. *H01L 21/02219* (2013.01); *H01L 21/02277* (2013.01); *H01L 21/02304* (2013.01); *H01L 21/02312* (2013.01)

(56) References Cited

U.S. PATENT DOCUMENTS

| | | |
|---|---|---|
| 6,593,000 B2 | 7/2003 | Ohtake et al. |
| 7,728,436 B2 | 6/2010 | Whelan et al. |
| 7,875,312 B2 | 1/2011 | Thridandam et al. |
| 8,043,907 B2 | 10/2011 | Ma et al. |
| 8,530,361 B2 | 9/2013 | Xiao et al. |
| 8,592,005 B2 | 11/2013 | Ueda |
| 8,668,957 B2 | 3/2014 | Dussarrat et al. |
| 8,821,986 B2 | 9/2014 | Weidman et al. |
| 8,853,075 B2 | 10/2014 | Gatineau et al. |
| 8,940,648 B2 | 1/2015 | Xiao et al. |
| 8,945,305 B2 | 2/2015 | Marsh |
| 9,219,007 B2 | 12/2015 | Chen et al. |
| 9,257,334 B2 | 2/2016 | Chen et al. |
| 9,331,094 B2 | 5/2016 | Hada |
| 9,371,338 B2 | 6/2016 | Dussarrat et al. |
| 9,911,595 B1 | 3/2018 | Smith et al. |
| 10,043,656 B1 | 8/2018 | Smith et al. |
| 10,176,984 B2 | 1/2019 | Smith et al. |
| 10,199,212 B2 | 2/2019 | Smith et al. |
| 10,242,866 B2 | 3/2019 | Smith et al. |
| 10,460,930 B2 | 10/2019 | Hausmann et al. |
| 10,490,413 B2 | 11/2019 | Smith et al. |
| 2004/0166680 A1 | 8/2004 | Miyajima et al. |
| 2004/0259378 A1 | 12/2004 | Chambers et al. |
| 2005/0017319 A1 | 1/2005 | Manabe et al. |
| 2005/0091931 A1 | 5/2005 | Gracias |
| 2005/0208778 A1 | 9/2005 | Li et al. |
| 2006/0128142 A1 | 6/2006 | Whelan et al. |
| 2008/0032064 A1 | 2/2008 | Gordon et al. |
| 2008/0237861 A1 | 10/2008 | Dominguez et al. |
| 2008/0242097 A1 | 10/2008 | Boescke et al. |
| 2011/0178092 A1 | 7/2011 | Ali et al. |
| 2011/0256721 A1 | 10/2011 | Gatineau |
| 2012/0205315 A1 | 8/2012 | Liu et al. |
| 2012/0315740 A1 | 12/2012 | Yao |
| 2013/0017328 A1 | 1/2013 | Miyoshi et al. |
| 2013/0323435 A1 | 12/2013 | Xiao et al. |
| 2014/0113457 A1 | 4/2014 | Sims et al. |
| 2014/0252486 A1 | 9/2014 | Lin et al. |
| 2014/0363969 A1 | 12/2014 | Chen et al. |
| 2015/0004806 A1 | 1/2015 | Ndiege et al. |
| 2015/0014823 A1 | 1/2015 | Mallikarjunan et al. |
| 2015/0087139 A1 | 3/2015 | O'Neill et al. |
| 2015/0111374 A1 | 4/2015 | Bao et al. |
| 2015/0147871 A1 | 5/2015 | Xiao et al. |
| 2015/0155523 A1 | 6/2015 | Kamiya |
| 2015/0235835 A1 | 8/2015 | Swaminathan et al. |
| 2015/0299848 A1 | 10/2015 | Haukka et al. |
| 2015/0340225 A1 | 11/2015 | Kim et al. |
| 2015/0364372 A1 | 12/2015 | Chen et al. |
| 2015/0371896 A1 | 12/2015 | Chen et al. |
| 2016/0024647 A1 | 1/2016 | Saly et al. |
| 2016/0056074 A1 | 2/2016 | Na et al. |
| 2016/0079521 A1 | 3/2016 | Draeger et al. |
| 2016/0126106 A1 | 5/2016 | Shimizu et al. |
| 2016/0280724 A1 | 9/2016 | Arkles et al. |
| 2016/0322213 A1 | 11/2016 | Thompson et al. |
| 2016/0376152 A1 | 12/2016 | Toutonghi |
| 2017/0004974 A1 | 1/2017 | Manna et al. |
| 2017/0029947 A1 | 2/2017 | Kawahara et al. |
| 2017/0029948 A1 | 2/2017 | Jongbloed et al. |
| 2017/0148642 A1 | 5/2017 | Wang et al. |
| 2017/0338109 A1 | 11/2017 | Lei et al. |
| 2018/0233349 A1 | 8/2018 | Smith et al. |
| 2018/0261447 A1 | 9/2018 | Smith et al. |
| 2018/0261448 A1 | 9/2018 | Smith et al. |
| 2018/0269058 A1 | 9/2018 | Smith et al. |
| 2018/0308680 A1 | 10/2018 | Reddy et al. |
| 2019/0115207 A1 | 4/2019 | Smith et al. |
| 2019/0157076 A1 | 5/2019 | Hausmann et al. |
| 2020/0013615 A1 | 1/2020 | Hausmann et al. |

FOREIGN PATENT DOCUMENTS

| | | |
|---|---|---|
| WO | WO 2014/209327 | 12/2014 |
| WO | WO 2016/048336 | 3/2016 |
| WO | WO 2016/138284 | 9/2016 |
| WO | WO 2016/209570 | 12/2016 |

OTHER PUBLICATIONS

U.S. Final Office Action dated May 3, 2018 issued in U.S. Appl. No. 15/432,634.

U.S. Notice of Allowance dated Sep. 6, 2018 issued in U.S. Appl. No. 15/432,634.

U.S. Notice of Allowance, dated Oct. 20, 2017, issued in U.S. Appl. No. 15/462,695.

U.S. Office Action, dated Feb. 8, 2018, issued in U.S. Appl. No. 15/453,815.

U.S. Notice of Allowance, dated Oct. 5, 2018, issued in U.S. Appl. No. 15/453,815.

U.S. Notice of Allowance, dated Oct. 23, 2017, issued in U.S. Appl. No. 15/456,301.

U.S. Notice of Allowance, dated Feb. 13, 2018, issued in U.S. Appl. No. 15/456,301.

U.S. Notice of Allowance, dated Sep. 25, 2018, issued in U.S. Appl. No. 15/975,554.

U.S. Office Action, dated Nov. 1, 2018, issued in U.S. Appl. No. 15/581,951.

International Search Report and Written Opinion dated Jun. 25, 2018 issued in Application No. PCT/US2018/021823.

Chabal* et al. (2016) "Atomic Layer Deposition of Silicon Dioxide Using Aminosilanes Di-sec-butylaminosilane and Bis(tert-butylamino)silane with Ozone," *The Journal of Physical Chemistry C*, ACS Publications, American Chemical Society, 120:10927-10935.

Chen, Rong and Bent*, Stacey F. (2006) "Chemistry for Positive Pattern Transfer Using Area-Selective Atomic Layer Deposition," *Adv. Mater.*, 18:1086-1090.

Chen et al. (2011) "Ozone-Based Atomic Layer Deposition of Crystalline $V_2O_5$ Films for High Performance Electrochemical Energy Storage," *Chemistry of Materials*, ACS Publications, American Chemical Society, 7pp.

Dangerfield et al. (2016) "Role of Trimethylaluminum (TMA) for Low Temperature $SiN_x$ Deposition: Growth Dependence on Number of TMA Exposures," *ALD Conference 2016*, 14pp.

Han et al. (2012) "On the Mechanisms of $SiO_2$ Thin-Film Growth by the Full Atomic Layer Deposition Process Using Bis(t-butylamino)silane on the Hydroxylated SiO2(001) Surface," *The Journal of Physical Chemistry C*, ACS Publications, American Chemical Society, 116:947-952.

Huang et al. (2017) "Design of efficient mono-aminosilane precursors for atomic layer deposition of $SiO_2$ thin films," *Royal Society of Chemistry Adv. 2017*, 7:22672-22678.

Li et al. (2014) "Low Temperature (LT) Thermal ALD Silicon Dioxide Using Ozone Process," *Arradiance Inc.*, Sudbury, MA USA, 1 page.

Liu et al. (Jun. 26-29, 2011) "High Rate Growth of $SiO_2$ by Thermal ALD Using Tris(di-methylamino)silane and Ozone," ALD 2011, *Cambridge NanoTech Inc.*, Cambridge, MA, USA, 14pp.

Ooba et al. (1998) "Self-Limiting Atomic-layer Selective Deposition of Silicon Nitride by Temperature-Controlled Method," *Extended Abstracts of the 1998 International Conference on Solid State Devices and Materials*, Hiroshima, pp. 22-23.

Putkonen et al. (2014) "Thermal and plasma enhanced atomic layer deposition of $SiO_2$ using commercial silicon precursors," *Thin Solid Films*, 558:93-98.

Sundstrom, (Dec. 2005) "Ozone as the Oxidizing Precursor in Atomic Layer Deposition," *Gas & Chemicals*, MKS Instruments, Inc., Wilmington, MA, 4pp.

(56) References Cited

OTHER PUBLICATIONS

Yokoyama et al. (1998) "Atomic-layer selective deposition of silicon nitride on hydrogen-terminated Si surfaces," *Applied Surface Science*, 130-132, 352-356.
U.S. Appl. No. 15/821,590, filed Nov. 22, 2017, Hausmann et al.
U.S. Appl. No. 16/206,915, filed Nov. 30, 2018, Smith et al.
U.S. Office Action dated Feb. 26, 2019 issued in U.S. Appl. No. 16/206,915.
U.S. Final Office Action dated Aug. 22, 2019 issued in U.S. Appl. No. 16/206,915.
U.S. Notice of Allowance dated Dec. 16, 2019 issued in U.S. Appl. No. 16/206,915.
U.S. Office Action, dated Feb. 25, 2019, issued in U.S. Appl. No. 15/878,349.
U.S. Notice of Allowance, dated Jul. 24, 2019, issued in U.S. Appl. No. 15/878,349.
U.S. Final Office Action dated Jun. 19, 2019, issued in U.S. Appl. No. 15/581,951.
U.S. Notice of Allowance dated Oct. 3, 2019, issued in U.S. Appl. No. 15/581,951.
U.S. Notice of Allowance dated Jun. 19, 2019, issued in U.S. Appl. No. 15/821,590.
International Preliminary Report on Patentability dated Sep. 19, 2019 issued in Application No. PCT/US2018/021823.
International Search Report and Written Opinion dated Mar. 13, 2019 issued in Application No. PCT/US2018/062301.
U.S. Appl. No. 16/713,557, filed Dec. 13, 2019, Reddy et al.

SELECTIVE DEPOSITION OF SILICON NITRIDE ON SILICON OXIDE USING CATALYTIC CONTROL

CROSS-REFERENCE TO RELATED APPLICATION

This application claims benefit of U.S. patent application Ser. No. 15/453,815, filed Mar. 8, 2017, and titled "SELECTIVE DEPOSITION OF SILICON NITRIDE ON SILICON OXIDE USING CATALYTIC CONTROL," which is incorporated by reference herein in its entirety and for all purposes.

BACKGROUND

Semiconductor device fabrication may involve deposition of silicon nitride films. Silicon nitride thin films have unique physical, chemical, and mechanical properties and thus are used in a variety of applications. For example, silicon nitride films may be used in diffusion barriers, gate insulators, sidewall spacers, encapsulation layers, strained films in transistors, and the like. Conventional methods of depositing silicon nitride films are not selective to dielectric materials.

SUMMARY

Provided herein are methods and apparatuses for processing semiconductor substrates. One aspect involves a method of depositing silicon nitride selectively on an exposed silicon oxide surface of a substrate, the method including: providing the substrate having the exposed silicon oxide surface and an exposed silicon surface; exposing the substrate to trimethylaluminum to form an aluminum-containing moiety selectively on the exposed silicon oxide surface relative to the exposed silicon surface; and performing one or more cycles of thermal atomic layer deposition, each cycle including exposing the substrate to an aminosilane precursor and exposing the substrate to a hydrazine without igniting a plasma to form silicon nitride selectively on the exposed silicon oxide surface relative to the exposed silicon surface, whereby the hydrazine has a chemical structure of:

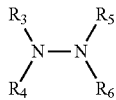

and whereby $R_3$, $R_4$, $R_5$, and $R_6$ are each hydrogen or an alkyl group.

In various embodiments, the method also includes periodically exposing the substrate to the trimethylaluminum every 20 to 40 cycles of the thermal atomic layer deposition.

In some embodiments, during the one or more cycles of thermal atomic layer deposition, the substrate resides on a pedestal set to a temperature between about 25° C. and about 400° C. In some embodiments, the temperature is between about 200° C. and about 300° C.

In some embodiments, during the one or more cycles of thermal atomic layer deposition, the substrate is disposed in a chamber having a chamber pressure between about 10 mTorr and about 10 Torr. In various embodiments, the chamber pressure is between about 1 Torr and about 3 Torr.

In various embodiments, exposing the substrate to the trimethylaluminum includes flowing the trimethylaluminum to a chamber housing the substrate at a flow rate between about 100 sccm and about 10,000 sccm.

In some embodiments, the hydrazine is any one of t-butylhydrazine and tetramethyl hydrazine.

In various embodiments, the aminosilane precursor has a chemical formula

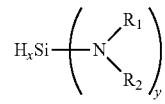

whereby x is an integer between and including 1 and 3, x+y=4 and each of $R_1$ and $R_2$ is hydrogen or an alkyl group.

In some embodiments, the aminosilane precursor is any one of monoaminosilane, diaminosilane, triaminosilane, tetraaminosilane, N'N'-dimethylsilanediamine, and combinations thereof.

In various embodiments, the substrate is disposed in a chamber and each cycle further includes purging the chamber between exposing the substrate to the aminosilane precursor and exposing the substrate to the hydrazine without igniting a plasma.

In some embodiments, during the exposing the substrate to the trimethylaluminum, the substrate is disposed in a chamber having a chamber pressure between about 10 mTorr and about 10 Torr.

In various embodiments, during the exposing the substrate to the trimethylaluminum, the substrate resides on a pedestal set to a temperature between about 25° C. and about 400° C.

In various embodiments, the substrate is disposed in a chamber and chamber pressure during the exposing the substrate to the trimethylaluminum is the same as the chamber pressure during the one or more cycles of thermal atomic layer deposition.

In various embodiments, the substrate resides on a pedestal having the same temperature during the exposing the substrate to the trimethylaluminum as during the one or more cycles of thermal atomic layer deposition.

In various embodiments, the exposed silicon oxide surface includes hydroxyl end groups.

In various embodiments, exposing the substrate to the trimethylaluminum is performed without igniting a plasma.

Another aspect involves a method of depositing silicon nitride selectively on an exposed silicon oxide surface of a substrate, the method including: providing the substrate having the exposed silicon oxide surface and an exposed silicon surface; exposing the substrate to transition metal-containing reactant to form a transition metal-containing moiety selectively on the exposed silicon oxide surface relative to the exposed silicon surface; and performing one or more cycles of thermal atomic layer deposition, each cycle including exposing the substrate to an aminosilane precursor and exposing the substrate to a hydrazine without igniting a plasma to form silicon nitride selectively on the exposed silicon oxide surface relative to the exposed silicon surface, whereby the hydrazine has a chemical structure of:

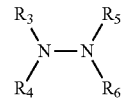

and whereby $R_3$, $R_4$, $R_5$, and $R_6$ are each hydrogen or an alkyl group.

The transition metal may be any suitable transition metal, including but not limited to titanium and nickel.

In some embodiments, the method also includes periodically exposing the substrate to the transition metal-containing reactant every 20 to 40 cycles of the thermal atomic layer deposition reaction.

In some embodiments, the transition metal-containing reactant is a strong Lewis acid.

During the one or more cycles of thermal atomic layer deposition, the substrate may reside on a pedestal set to a temperature between about 25° C. and about 400° C. In some embodiments, the temperature is between about 200° C. and about 300° C.

In some embodiments, during the one or more cycles of thermal atomic layer deposition, the substrate is disposed in a chamber having a chamber pressure between about 10 mTorr and about 10 Torr. In various embodiments, the chamber pressure is between about 1 Torr and about 3 Torr.

Exposing the substrate to the transition metal-containing reactant may include flowing the transition metal-containing reactant to a chamber housing the substrate at a flow rate between about 100 sccm and about 10,000 sccm.

In various embodiments, the hydrazine is any one of t-butylhydrazine and tetramethyl hydrazine.

In various embodiments, the aminosilane precursor has a chemical formula

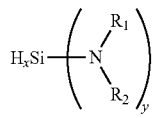

whereby x is an integer between and including 1 and 3, x+y=4 and each of $R_1$ and $R_2$ is hydrogen or an alkyl group. In some embodiments, the aminosilane precursor is any one of monoaminosilane, diaminosilane, triaminosilane, tetraaminosilane, N'N'-dimethylsilanediamine, and combinations thereof.

In various embodiments, the substrate is disposed in a chamber and each cycle further includes purging the chamber between exposing the substrate to the aminosilane precursor and exposing the substrate to the hydrazine without igniting a plasma.

In some embodiments, during the exposing the substrate to the trimethylaluminum, the substrate is disposed in a chamber having a chamber pressure between about 10 mTorr and about 10 Torr.

In various embodiments, during the exposing the substrate to the trimethylaluminum, the substrate resides on a pedestal set to a temperature between about 25° C. and about 400° C.

In various embodiments, the substrate is disposed in a chamber and chamber pressure during the exposing the substrate to the trimethylaluminum is the same as the chamber pressure during the one or more cycles of thermal atomic layer deposition.

In various embodiments, the substrate resides on a pedestal having the same temperature during the exposing the substrate to the trimethylaluminum as during the one or more cycles of thermal atomic layer deposition.

In various embodiments, the exposed silicon oxide surface includes hydroxyl end groups.

In various embodiments, exposing the substrate to the trimethylaluminum is performed without igniting a plasma.

Another aspect involves an apparatus for processing semiconductor substrates, the apparatus including: at least one process chamber including a pedestal for holding a substrate; at least one outlet for coupling to a vacuum; one or more process gas inlets coupled to one or more trimethylaluminum gas sources; one or more process gas inlets coupled to one or more aminosilane gas sources; one or more process gas inlets coupled to one or more hydrazine gas sources; and a controller for controlling operations in the apparatus, including machine-readable instructions for: introducing trimethylaluminum to the substrate to modify a silicon oxide surface to form an aluminum-containing moiety on the silicon oxide surface; and introducing alternating pulses of an aminosilane gas and a hydrazine gas to selectively form silicon nitride on the silicon oxide surface relative to a silicon surface on the substrate by thermal atomic layer deposition.

These and other aspects are described further below with reference to the drawings.

DETAILED DESCRIPTION

Figure 1:
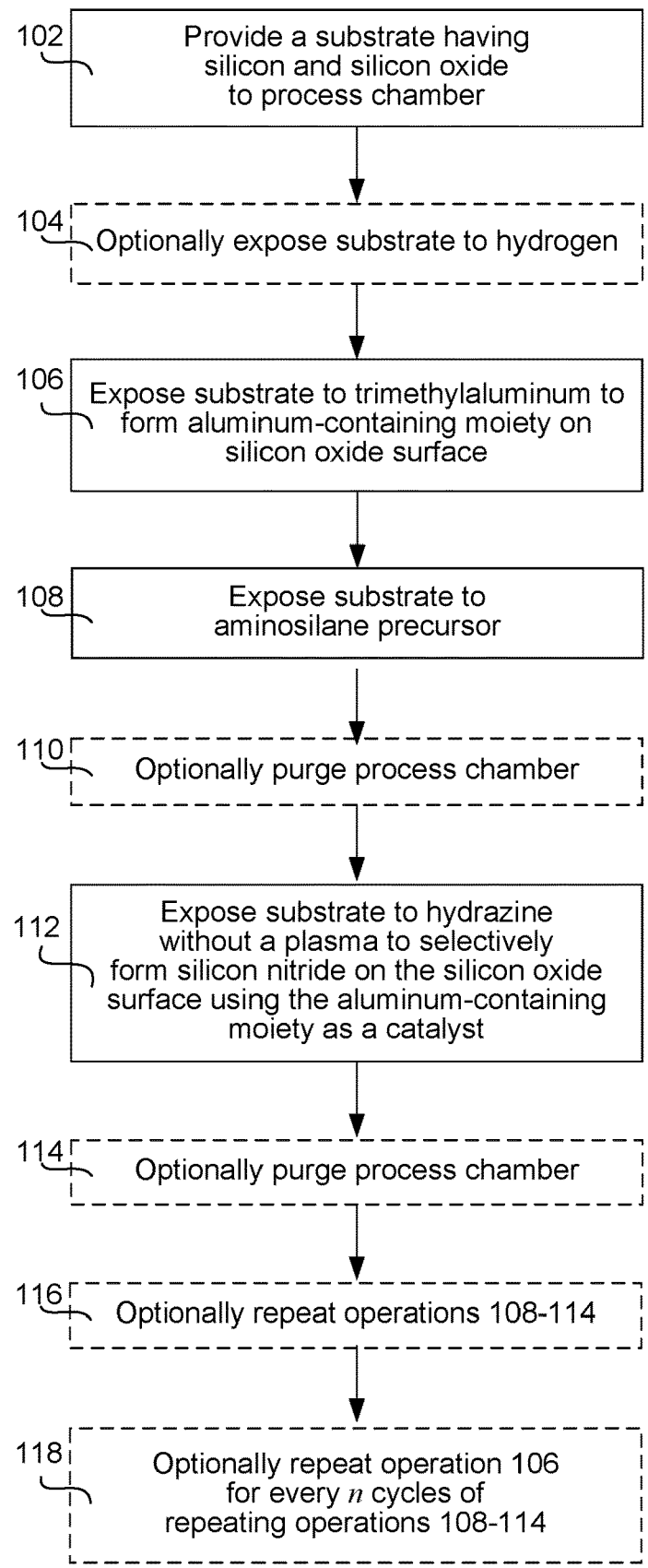
FIG. 1 is a process flow diagram depicting operations for a method in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve deposition of silicon nitride material. In one example, silicon nitride may be used in semiconductor device fabrication as diffusion barriers, gate insulators, sidewall spacers, and encapsulation layers. Conformal silicon nitride layers may also be used in other applications. For example, silicon nitride may be used during fabrication of memory structures.

Conventional atomic layer deposition (ALD), plasma-enhanced atomic layer deposition (PEALD), chemical vapor deposition (CVD), and plasma-enhanced chemical vapor deposition (PECVD) techniques for depositing silicon nitride layers are generally not selective to dielectric materials. Although some techniques exist for selectively depositing metal oxide on oxide materials relative to metal, and selectively depositing metal oxide on metal materials relative to oxide, such techniques are insufficient to deposit dielectric material selectively relative to other dielectric material.

Provided herein are methods of selectively depositing silicon nitride on silicon oxide relative to silicon. Techniques involve introducing an aluminum-containing reactant to the substrate to form an aluminum-containing moiety on the silicon oxide surface, which can thereby catalyze the reaction between an aminosilane and a hydrazine to form silicon nitride without igniting a plasma. The aluminum-containing reactant is selected such that it is reactive with silicon oxide but has little or no reactivity to silicon, thereby allowing only the catalyzing moiety to form on the silicon oxide surface. A transition metal-containing reactant may also be used as an alternative to the aluminum-containing reactant to form a transition metal-containing moiety on the silicon oxide surface. The transition metal-containing reactant is also selected such that it is reactive with silicon oxide but has little or no reactivity with silicon to allow selective formation of silicon nitride on the silicon oxide surface. Some embodiments may also include forming silicon oxide on the silicon oxide surface selectively by using a silicon-containing precursor and oxidizing reactant that uses the aluminum-containing moiety or transition metal-containing moiety as a catalyst for forming silicon oxide.

Techniques described herein involve thermal atomic layer deposition (ALD). That is, in various embodiments, the reaction between a silicon-containing precursor and hydrazine to form silicon nitride is performed without igniting a plasma. ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon nitride deposition cycle may include the following operations: (i) delivery/adsorption of an aminosilane, (ii) purging of the silicon precursor from the chamber, (iii) delivery of a hydrazine gas, and (iv) purging of the hydrazine gas from the chamber.

Unlike a chemical vapor deposition (CVD) technique, ALD processes use surface mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as hydrazine, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

FIG. 1 is a process flow diagram depicting example operations of a method performed in accordance with certain disclosed embodiments. In operation 102, a substrate having an exposed silicon surface and exposed silicon oxide surface is provided to a process chamber. The silicon surface may be a poly-silicon or amorphous silicon surface in various embodiments.

The process chamber may be set to a chamber pressure between about 10 mTorr and about 10 Torr, or between about 1 Torr and about 3 Torr. Such chamber pressures may be used throughout operations 102-118 as described herein. The substrate may be heated to a substrate temperature between about 25° C. and about 400° C., or between about 200° C. and about 300° C. It will be understood that substrate temperature as used herein refers to the temperature that the pedestal holding the substrate is set at and that in some embodiments, the substrate when provided to the process chamber on the pedestal may be heated to the desired substrate temperature prior to processing the substrate. The substrate temperature may be the same throughout operations 102-118 as described herein.

The substrate may be a silicon wafer, e.g., a 200-mm wafer, a 300-mm wafer, or a 450 mm wafer, including wafers having one or more layers of material, such as dielectric, conducting, or semi conducting material deposited thereon. Non-limiting examples of under layers include dielectric layers and conducting layers, e.g., silicon oxides, silicon nitrides, silicon carbides, metal oxides, metal nitrides, metal carbides, and metal layers. In some embodiments, the substrate includes silicon oxide and silicon, as shown in FIG. 2A.

Figure 2A:
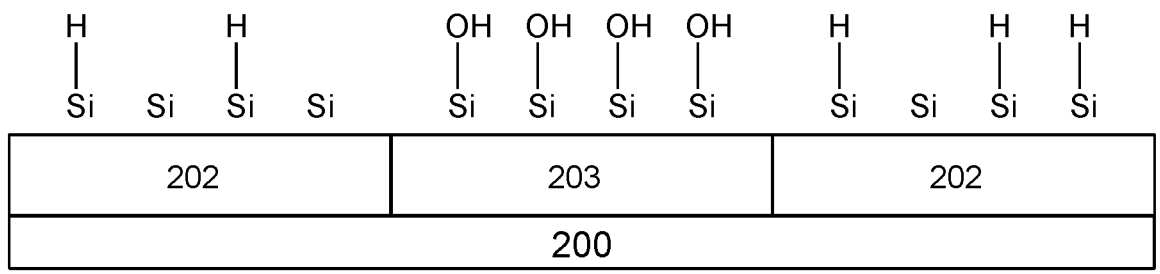
FIGS. 2A-2G are schematic illustrations of substrates undergoing operations described in accordance with certain disclosed embodiments.
Figure 2B:
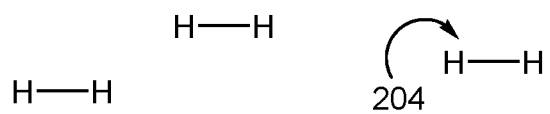
Figure 2B:
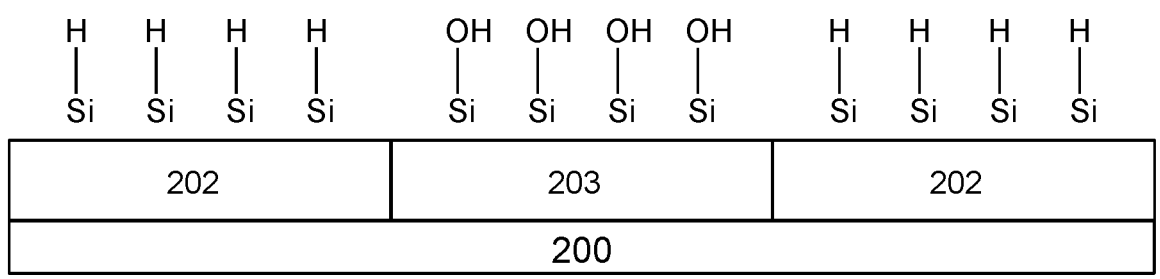

FIG. 2A shows a substrate 200 having an exposed silicon oxide surface 203 and exposed silicon surfaces 202. The silicon oxide surface includes hydroxyl end groups, which may be formed from ambient air ($H_2O$ and $O_2$) or from a mild etchant such as 1% hydrofluoric acid (HF) in $H_2O$. The hydroxyl end groups on silicon oxide may also be formed due to the technique used to form the silicon oxide 203 material. For example, a hydroxyl-terminated surface may be formed when silicon oxide is deposited using a vapor phase method such as chemical vapor deposition (CVD), or atomic layer deposition (ALD). Exposed silicon surfaces 202 may have some Si—H bonds. In some embodiments, in operation 104 of FIG. 1, the substrate may be optionally exposed to hydrogen such that hydrogen 204 in FIG. 2B hydrogenates the exposed silicon surface 202. In various embodiments, this operation is optional as the subsequently discussed mechanism for selectively depositing silicon nitride may not depend on the presence of fully hydrogenated silicon atoms on the surface of the exposed silicon.

Returning to FIG. 1, in operation 106, the substrate is exposed to trimethylaluminum to form an aluminum-containing moiety on the silicon oxide surface. This operation is performed without igniting a plasma. In various embodiments, instead of trimethylaluminum, another aluminum-containing gas may be used to form the aluminum-containing moiety on the silicon oxide surface. In various embodiments, instead of an aluminum-containing gas used to form an aluminum-containing moiety, a transition metal-containing reactant or gas is used to form a transition metal-containing moiety on the surface of the silicon oxide surface. The transition metal may be any suitable transition metal. Some examples include but are not limited to titanium and nickel. For example, in some embodiments, a titanium-containing gas may be used to form a titanium-containing moiety on the silicon oxide surface. Example titanium-containing gases include titanium chloride (e.g., TiCl$_4$) and titanium alkoxides such as titanium isopropoxide (e.g., Ti(OCH(CH$_3$)$_2$)$_4$). In various embodiments, a strong Lewis acid is used during operation 106 to form the moiety on the silicon oxide surface. For example, in some embodiments, tetrakis dimethylamino titanium (Ti(N(CH$_3$)$_2$)$_4$) may be used to form the moiety on the silicon oxide surface. Hydrides may not be used during operation 106 as they may be too reactive with the substrate surface. For example, aluminum hydride may not be a suitable aluminum-containing gas for forming an aluminum-containing moiety on the silicon oxide surface.

In some embodiments, an inert gas may be flowed during operation 106. In some embodiments, the inert gas acts as a carrier gas in delivering trimethylaluminum to the substrate. In some embodiments, a carrier gas may be diverted prior to delivering trimethylaluminum to a process chamber housing the substrate. Example inert gases that may be used include argon, helium, and neon. In some embodiments, the inert gas may be provided to assist with pressure and/or temperature control of the process chamber, evaporation of a liquid reactant, more rapid delivery of the reactant and/or as a sweep gas for removing process gases from the process chamber and/or process chamber plumbing.

Figure 2C:
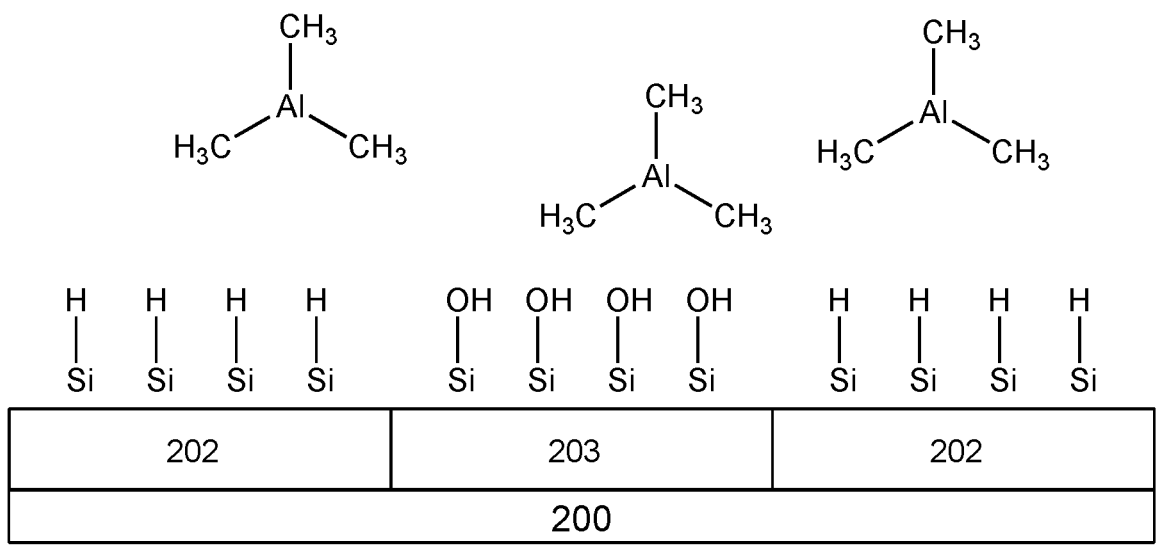
Figure 2D:
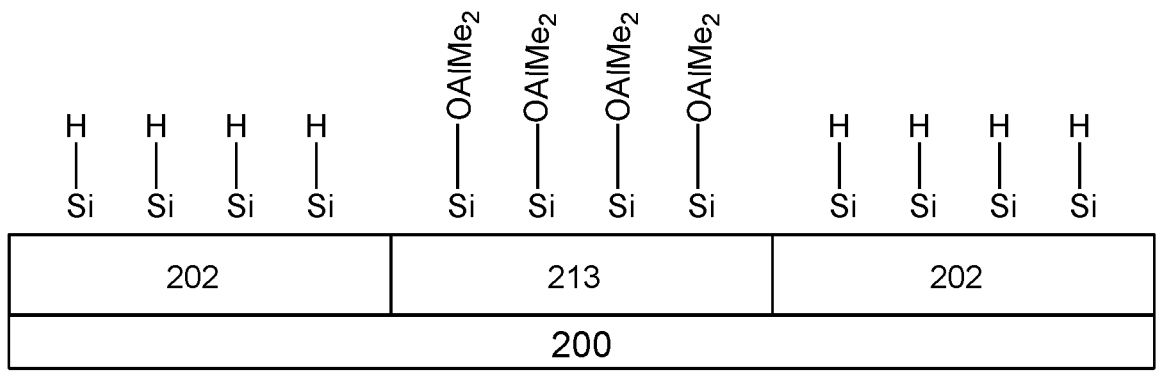

In FIG. 2C, trimethylaluminum is introduced to the substrate. As shown in FIG. 2D, trimethylaluminum selectively reacts with the Si—OH bonds of the exposed silicon oxide surface 203 to form aluminum-containing moieties on the surface such that the exposed silicon oxide surface 203 now includes Si—OAlMe$_2$ on a modified silicon oxide surface 213. As trimethylaluminum does not react as readily with the Si—H terminated surface of the silicon surface, the silicon surface 202 remains unreacted. Trimethylaluminum may react with the Si—H terminated surface only at or above the thermal decomposition temperature of trimethylaluminum, which is greater than 300° C. Accordingly, embodiments described herein may be performed at temperatures between about 200° C. and about 300° C.

Returning to FIG. 1, in operation 108, the substrate is exposed to an aminosilane precursor which may adsorb onto the surface of the substrate. Note that operations 108-114 may constitute an ALD cycle, as described elsewhere herein.

Aminosilanes referred to herein include aminosilanes, such as bis(tertbutyl)aminosilane and silylamines such as trisilylamine. In some embodiments, aminosilane molecules may adsorb onto both silicon oxide and silicon surfaces, but as described below with respect to operation 112, silicon oxide is formed selectively on silicon oxide surface and not on the silicon nitride surface due to the presence of the aluminum-containing moiety or transition metal-containing moiety on the silicon oxide surface used as a catalyst for forming silicon nitride. In some embodiments, adsorption on the surface of the substrate may be form a thin layer of the aminosilane on the surface of the substrate. The thin layer may be less than a monolayer, and may have a thickness between about 0.2 Å and about 0.4 Å.

The aminosilane used in operation 106 has a chemical formula as follows:

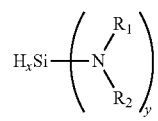

where x is an integer between and including 1 and 3, x+y=4 and each of R$_1$ and R$_2$ is hydrogen or an alkyl group. In various embodiments, R$_1$ and R$_2$ are different alkyl group, which may have different structures and/or different number of carbon atoms. For example, in some embodiments, the aminosilane is monoaminosilane, which has the chemical structure:

where each of R$_1$ and R$_2$ is hydrogen or an alkyl group.

The aminosilane in some embodiments may be any of monoaminosilane, diaminosilane, triaminosilane, tetraaminosilane, and combinations thereof. Chemical structures for these examples are provided below:

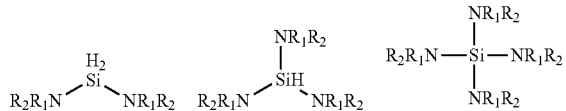

It will be understood that in some embodiments, nitrogen-containing ligands bonded to the silicon may not necessarily be identical to another nitrogen-containing ligand bonded to the same silicon atom. For example, in some embodiments, R$_1$ and R$_2$ may be different alkyl ligands. In some embodiments, a first NR$_1$R$_2$ ligand attached to a silicon atom may not be the same as or have the same alkyl ligands as another NR$_1$R$_2$ ligand attached to the same silicon atom. As noted above, R$_1$ and R$_2$ may be any alkyl ligand. In one example, the aminosilane may be N,N'-dimethylsilanediamine, having the structure:

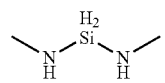

N,N'-dimethylsilanediamine

Silicon alkoxides, such as tetraethyl orthosilicate (TEOS), silicon halides, and silane (SiH₄) are not used as a silicon precursor for depositing silicon nitride in various embodiments as they may not be sufficiently reactive toward the surface species on a silicon nitride film.

Figure 2E:
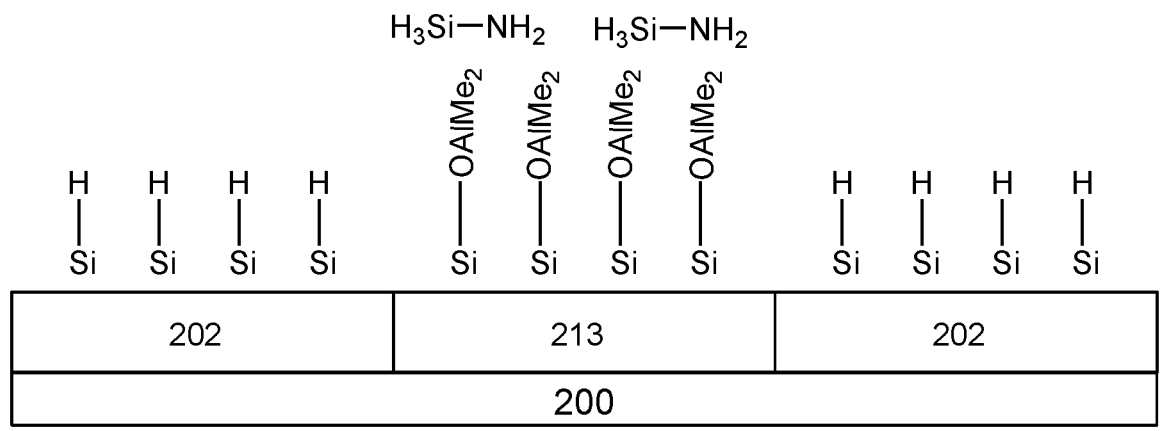

FIG. 2E shows an example of monoaminosilane adsorbed onto the surface of modified silicon oxide surface 213. In various embodiments, monoaminosilane may also be adsorbed onto the surface of the exposed silicon 202 (not shown).

In operation 110, the process chamber is optionally purged to remove aminosilane that did not adsorb onto a substrate surface. Purging the chamber may involve flowing a purge gas or a sweep gas, which may be a carrier gas used in other operations or may be a different gas. In some embodiments, the purge gas is an inert gas, such as that described above with respect to operation 106. In some embodiments, purging may involve evacuating the chamber. Example purge gases include argon, nitrogen, hydrogen, and helium. In some embodiments, operation 108 may include one or more evacuation subphases for evacuating the process chamber. Alternatively, it will be appreciated that operation 110 may be omitted in some embodiments. Operation 110 may have any suitable duration, such as between about 0 seconds and about 60 seconds, for example about 0.01 seconds. In some embodiments, increasing a flow rate of one or more purge gases may decrease the duration of operation 110. For example, a purge gas flow rate may be adjusted according to various reactant thermodynamic characteristics and/or geometric characteristics of the process chamber and/or process chamber plumbing for modifying the duration of operation 110. In one non-limiting example, the duration of a purge phase may be adjusted by modulating purge gas flow rate. This may reduce deposition cycle time, which may improve substrate throughput. After a purge, the aminosilane molecules remain adsorbed onto the substrate surface. In some embodiments, the aminosilane precursor is flowed to a chamber housing the substrate at a flow rate between about 1000 sccm and about 5000 sccm. In some embodiments, aminosilane precursors adsorbed onto silicon surfaces may be removed during this operation.

Figure 2F:
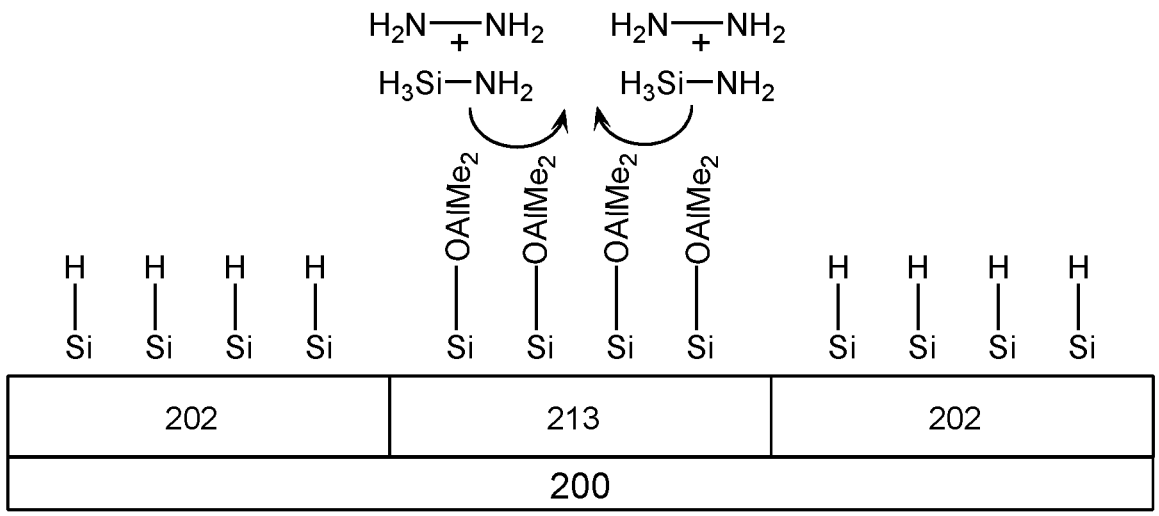
Figure 2G:
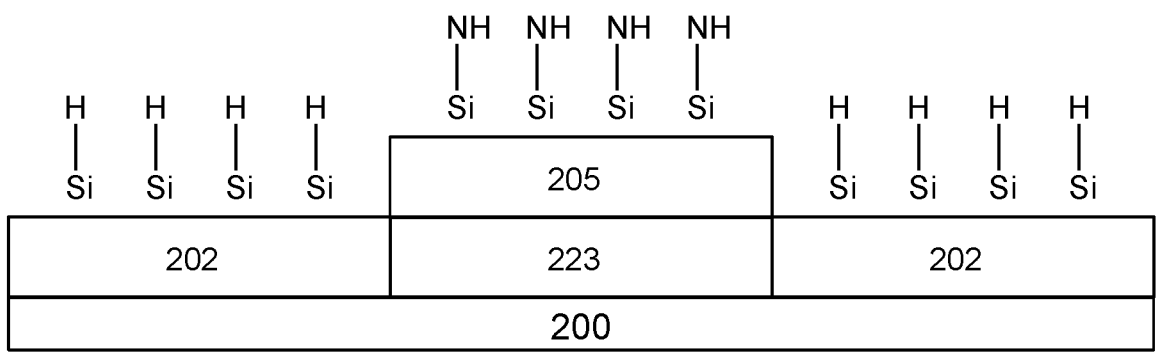

In operation 112, the substrate is exposed to a hydrazine without a plasma to selectively form silicon nitride on the silicon oxide surface, relative to exposed silicon surfaces. Although some aminosilane precursors may remain adsorbed to the exposed silicon surfaces, hydrazine will not react with the aminosilane precursors on those surfaces because a plasma is not ignited and the silicon surface does not include an aluminum-containing or transition metal-containing catalyst used to react an aminosilane with a hydrazine. Hydrazine will react with the aminosilane precursors adsorbed on the surface of the modified silicon oxide surface because the aluminum-containing moiety acts as a catalyst to catalyze the reaction between the aminosilane precursor and the hydrazine. An example is shown in FIG. 2F, whereby the Si—OAlMe₂ catalyzes the reaction between monoaminosilane and hydrazine to thereby form a silicon nitride 205 on the silicon oxide surface 223 as shown in FIG. 2G. Thus, silicon nitride 205 is formed selectively on surfaces having the aluminum-containing moiety thereby forming selectively on silicon oxide surfaces (223) and not forming on silicon surfaces (202).

Hydrazines used during operation 110 have the structure:

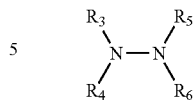

where R₃, R₄, R₅, and R₆ are each hydrogen or alkyl groups. For example, hydrazine may be used, whereby hydrazine has the structure:

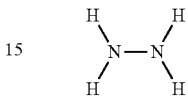

In another example, t-butylhydrazine, which has the following structure, may be used:

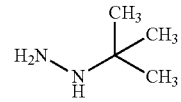

In another example, tetramethyl hydrazine, which has the following structure, may be used:

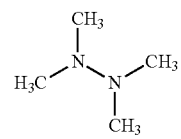

In some embodiments, one or more hydrazines may be introduced as a mixture. Hydrazines may be delivered to the substrate as a gas. In some embodiments, a hydrazine may be delivered using a carrier gas such that the carrier gas and hydrazine gas co-flow to the substrate. In some embodiments, the carrier gas may be an inert gas, such as those described above with respect to operation 106. In some embodiments, the carrier gas is diverted prior to delivering the hydrazine gas into a chamber housing the substrate. In some embodiments, a hydrazine may be vaporized from liquid phase upstream of the substrate and introduced into the chamber as a gas. A vaporized hydrazine may likewise be introduced using a carrier gas by co-flowing the vaporized hydrazine precursor with the carrier gas. Similarly, the carrier gas may be diverted in some embodiments prior to delivering the vaporized hydrazine precursor to the substrate. A hydrazine used in operation 112 may be delivered to a chamber housing the substrate at a flow rate between about 100 sccm and about 10000 sccm, or between about 1000 sccm and about 5000 sccm. As described above, the chamber pressure of the chamber housing the substrate may be constant throughout operations 102-118. That is, in various embodiments, the chamber pressure during operation 112 is the same as the chamber pressure during operations 108, 110, and 114. In various embodiments the chamber pressure during operation 112 may be the same as the chamber pressure during operations 104, or operation 106, or both operations 104 and 106.

In operation 114, the chamber is optionally purged to remove any residual byproducts. The chamber may be purged using any of the conditions described above with respect to operation 110. For example, in some embodiments, the chamber is purged by flowing an inert gas, such as argon, to pump excess molecules and/or residual byproducts from the chamber.

In operation 116, it is determined whether the desired thickness of film has been deposited. If not, operations 108-114 are repeated in sufficient cycles to deposit a desired thickness of silicon nitride. Any suitable number of deposition cycles may be included in an ALD process to deposit a desired film thickness of silicon nitride. For example, about 20 to about 40 deposition cycles may be performed to deposit a silicon nitride film on the substrate using disclosed embodiments. In some embodiments, 20 to 40 depositions are performed.

Note that while FIG. 1 and the description provided herein describe the exposure to aminosilane precursor occurring before hydrazine exposure, it will be understood that in some embodiments, hydrazine exposure may be performed prior to aminosilane precursor exposure. That is, in some embodiments, after operation 106, operation 112 may be performed, followed by a purge operation such as operation 114, then operation 108 may be performed, followed by purge operation 110. In such embodiments, the presence of the transition metal-containing moiety on the substrate will still catalyze the reaction between a hydrazine and an aminosilane if hydrazine is provided to the substrate prior to providing aminosilane. In some embodiments, following operation 106, operation 108 is performed, followed by operation 110, and operation 112, and operation 114.

In operation 118, operation 106 is optionally repeated every n cycles of repeating operations 108-114. As performing operations 108-114 may constitute one cycle of thermal ALD of silicon nitride, operation 106 may be performed every n cycles of thermal ALD of silicon nitride. In various embodiments, n is an integer between and including 20 and 40. For example, in some embodiments, operation 106 is performed every 20 to every 40 cycles of repeating operations 108-114. Operation 106 is performed every n cycles of performing thermal ALD of silicon nitride to replenish the amount of transition metal-containing moiety on the surface of the substrate to have sufficient transition metal to catalyze the reaction between the aminosilane and hydrazine. In one example, the substrate is periodically exposed to trimethylaluminum between multiple cycles of ALD of silicon nitride to ensure there is enough aluminum on the substrate to catalyze the reaction between monoaminosilane and t-butylhydrazine. If there is insufficient aluminum on the substrate, then the reaction may not be catalyzed and aminosilanes may not be reactive with hydrazines.

Note that while embodiments described herein describe methods of selectively depositing silicon nitride on a silicon oxide surface relative to a silicon surface, similar techniques may also be performed for selectively depositing silicon oxide on a silicon oxide surface relative to a silicon surface. For example, where trimethylaluminum is used to modify a silicon oxide surface, silicon-containing precursors and oxidizing agents may be selected such that the modified aluminum-containing moiety catalyzes a reaction between a selected silicon-containing precursor and a selected oxidizing agent to selectively deposit silicon oxide on the silicon oxide surface. Since trimethylaluminum has little to no reactivity with a silicon surface, silicon oxide or silicon nitride films that use the transition metal moiety as a catalyst can be selectively deposited on a silicon oxide surface without depositing silicon oxide or silicon nitride respectively on the silicon surface because the silicon surface does not have terminated groups that can catalyze the thermal atomic layer deposition reaction to deposit the respective material.

Figure 3:
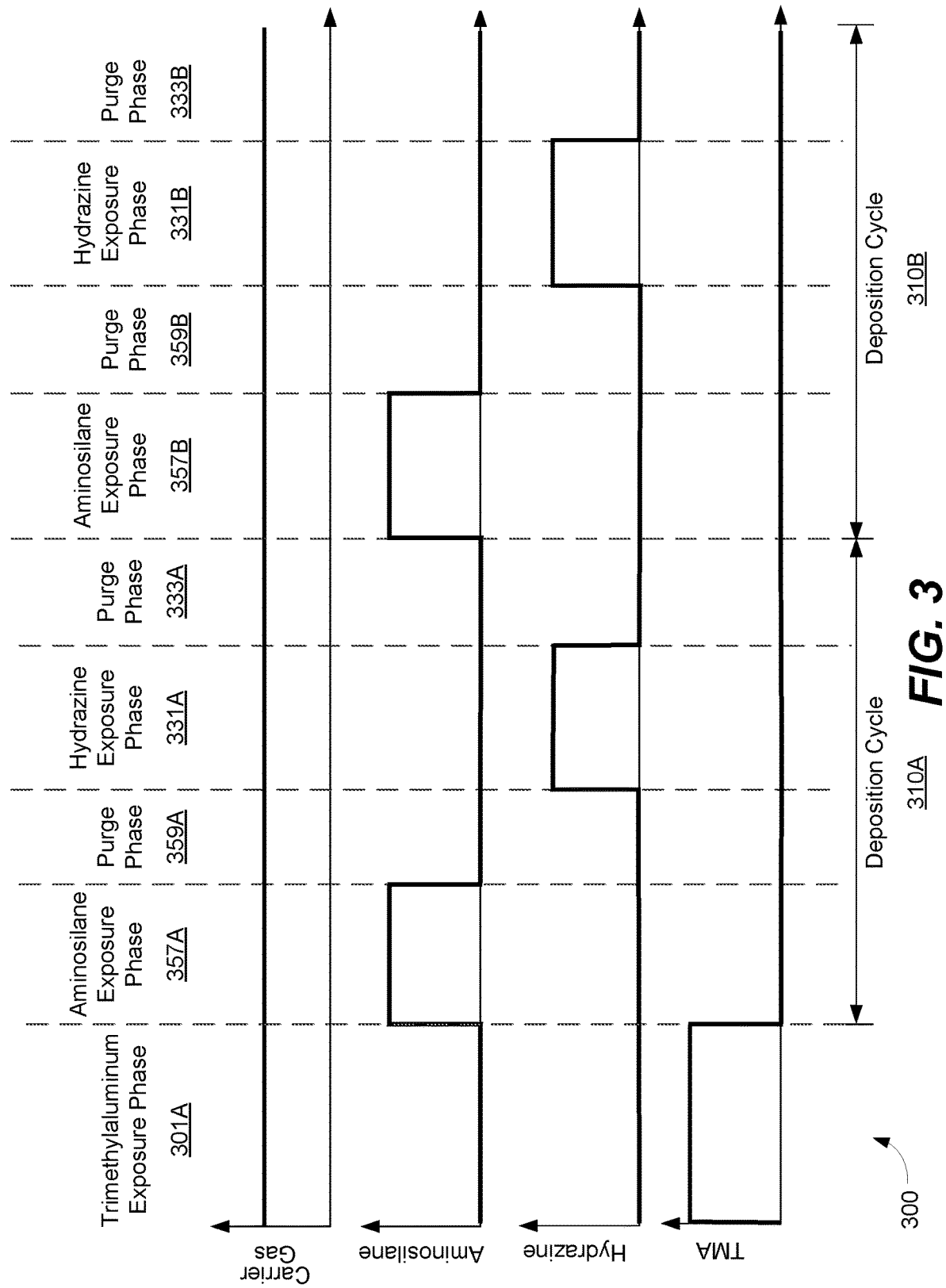
FIG. 3 is a timing sequence diagram showing an example of cycles in a method in accordance with certain disclosed embodiments.

FIG. 3 provides a timing sequence diagram showing an example of cycles in a method in accordance with certain disclosed embodiments. The timing sequence diagram shows the on or off phase for flows of a carrier gas, aminosilane gas, hydrazine gas, and trimethylaluminum gas (depicted as "TMA" in FIG. 3). Although trimethylaluminum is depicted in FIG. 3, it will be understood that any suitable gas for use in operation 106 of FIG. 1 may be used in lieu of trimethylaluminum.

FIG. 3 includes a process 300 having a trimethylaluminum exposure phase 301A and two deposition cycles—deposition cycle 310A and deposition cycle 310B. Note that although only two deposition cycles are depicted, more deposition cycles may be repeated. Additionally, additional trimethylaluminum exposure phases may be used periodically every n deposition cycles, such as every 20 to 40 deposition cycles.

During trimethylaluminum exposure phase 301A, a carrier gas may flow. The carrier gas may be any gas as described above with respect to operations 106 and 108. In various embodiments, the carrier gas is an inert gas, such as argon, helium, or neon. Note that trimethylaluminum exposure phase 301A may correspond to operation 106 of FIG. 1. During trimethylaluminum exposure phase 301A, aminosilane flow and hydrazine flows are turned off, while trimethylaluminum flow is turned on. Deposition cycle 310A includes aminosilane exposure phase 357A, purge phase 359A, hydrazine exposure phase 331A, and purge phase 333A. These phases in deposition cycle 310A may constitute a thermal atomic layer deposition cycle as described elsewhere herein. In aminosilane exposure phase 357A, which may correspond to operation 108 of FIG. 1, carrier gas may continue to flow while aminosilane flow is turned on, while hydrazine flows and trimethylaluminum flow is turned off. In purge phase 359A, carrier gas flow may continue to be turned on. In some embodiments, the carrier gas flow is directed into the chamber to act as a purge or sweep gas as described elsewhere herein. During purge phase 359A, aminosilane gas flow, hydrazine gas flow, and trimethylaluminum gas flows are turned off. Purge phase 359A may correspond to operation 110 of FIG. 1. In hydrazine exposure phase 331A, carrier gas may continue to flow, which may be used, in some instances, to provide hydrazine to a chamber housing the substrate to be processed. During hydrazine exposure phase 331A, aminosilane gas flow and trimethylaluminum gas flow are turned off, while hydrazine gas flow is turned on. Hydrazine exposure phase 331A may correspond to operation 112 of FIG. 1. During purge phase 333A, a carrier gas may continue to flow while aminosilane gas, hydrazine gas, and trimethylaluminum gas flows are turned off. As described above, the carrier gas may in some embodiments be an inert gas used to pump out reaction byproducts. Purge phase 333A may correspond to operation 114 of FIG. 1.

The phases of deposition cycle 310A may be repeated in deposition cycle 310B, as shown in FIG. 3. Repeating the phases may correspond to operation 116 of FIG. 1. Deposition cycle 310B includes aminosilane exposure phase 357B, which may correspond to a repeated operation of operation 108, purge phase 359B, which may correspond to a repeated operation of operation 110, hydrazine exposure phase 331B, which may correspond to a repeated operation of operation 112, and purge phase 333B, which may correspond to a repeated operation of operation 114. During aminosilane exposure phase 357B, carrier gas flow and aminosilane gas flows are turned on while hydrazine and trimethylaluminum gas flows are turned off. During purge phase 359B, carrier gas flow continues to be turned on while aminosilane, hydrazine, and trimethylaluminum gas flows are turned off. During hydrazine exposure phase 331B, carrier gas flow and hydrazine gas flow are turned on while aminosilane and trimethylaluminum gas flows are turned off. During purge phase 333B, carrier gas flow remains on while aminosilane gas flow, hydrazine gas flow, and trimethylaluminum gas flows are turned off.

Apparatus

Figure 4:
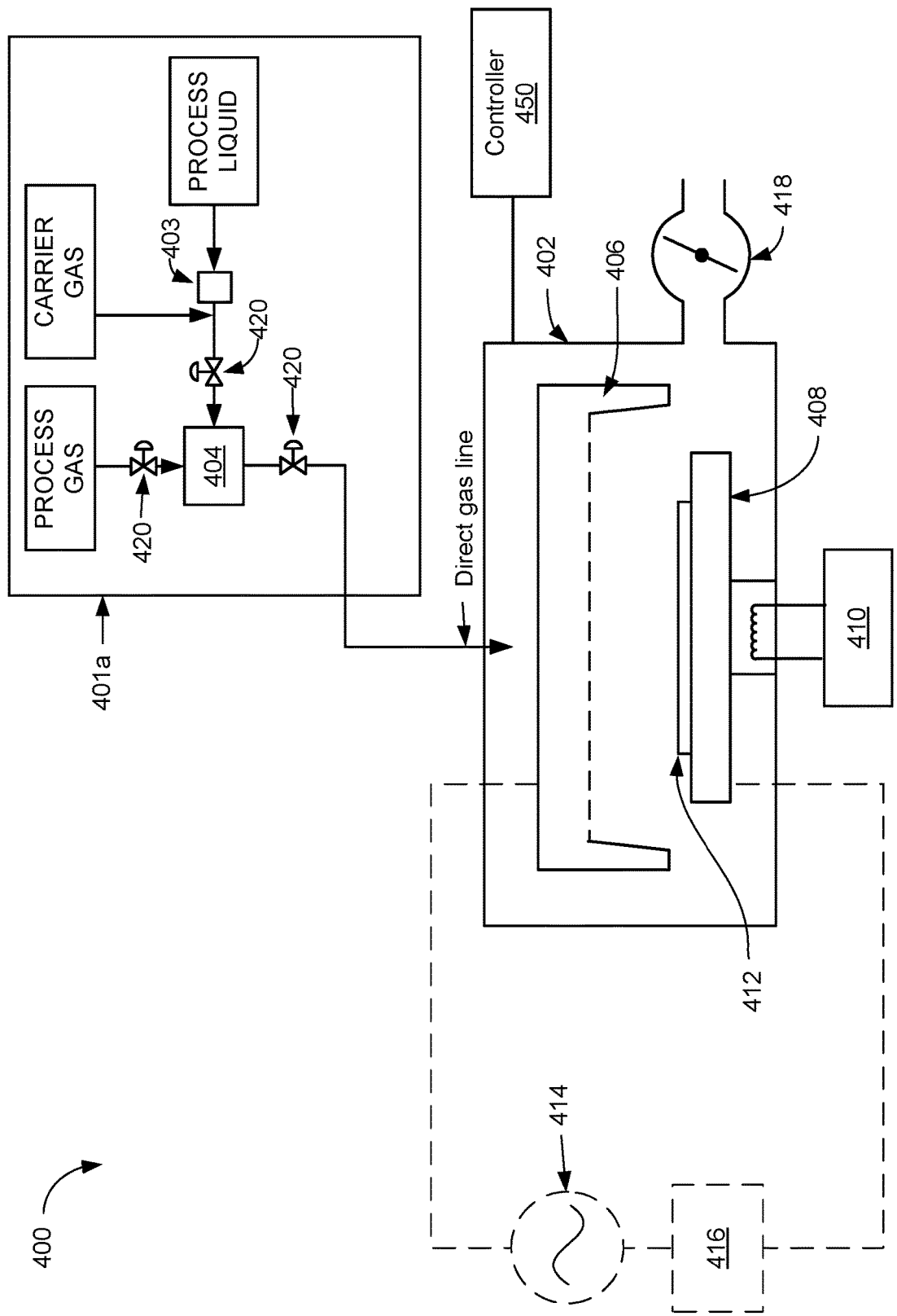
FIG. 4 is a schematic diagram of an example process chamber for performing certain disclosed embodiments.
Figure 5:
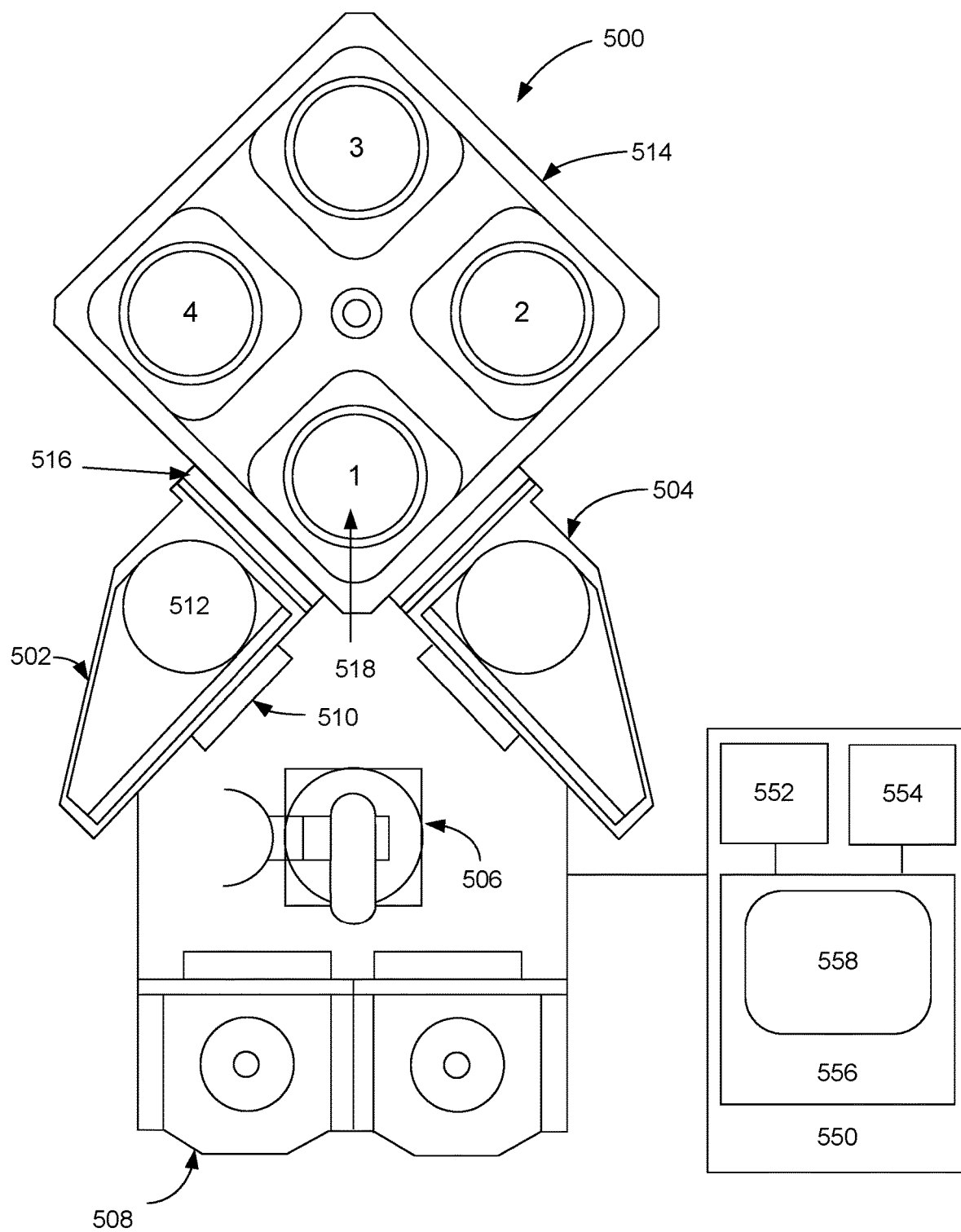
FIG. 5 is a schematic diagram of an example process tool for performing certain disclosed embodiments.

FIG. 4 depicts a schematic illustration of an embodiment of an atomic layer deposition (ALD) process station 400 having a process chamber body 402 for maintaining a low-pressure environment. A plurality of ALD process stations 400 may be included in a common low pressure process tool environment. For example, FIG. 5 depicts an embodiment of a multi-station processing tool 500. In some embodiments, one or more hardware parameters of ALD process station 400 including those discussed in detail below may be adjusted programmatically by one or more computer controllers 450.

ALD process station 400 fluidly communicates with reactant delivery system 401a for delivering process gases to a distribution showerhead 406. Reactant delivery system 401a includes a mixing vessel 404 for blending and/or conditioning process gases, such as trimethylaluminum, or a transition metal-containing gas, or an aminosilane precursor gas, or hydrazine gas, for delivery to showerhead 406. One or more mixing vessel inlet valves 420 may control introduction of process gases to mixing vessel 404.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a suitable computer controller 450.

In another scenario, adjusting a height of pedestal 408 may allow a plasma density to be varied during plasma activation cycles in the process in embodiments where a plasma is ignited. At the conclusion of the process phase, pedestal 408 may be lowered during another substrate transfer phase to allow removal of substrate 412 from pedestal 408.

In some embodiments, pedestal 408 may be temperature controlled via heater 410. In some embodiments, the pedestal 408 may be heated to a temperature of between about 25° C. and about 400° C., or between about 200° C. and about 300° C., during selective deposition of silicon nitride films as described in disclosed embodiments. In some embodiments, the pedestal is set at a temperature between about 25° C. and about 400° C., or between about 200° C. and about 300° C.

Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are about 150 W to about 6000 W. RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of a transition metal-containing gas such as trimethylaluminum, instructions for setting a flow rate of a carrier gas (such as argon), and time delay instructions for the first recipe phase. A second recipe phase may include instructions for setting a flow rate of an inert and/or aminosilane precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of a hydrazine gas, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to an optional mild etchant of HF in $H_2O$ or may be exposed to ambient in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode.

Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system for transferring wafers within processing chamber 514. In some embodiments, wafer handling system may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., transition metal-containing gases such as trimethylaluminum, aminosilane gases, and hydrazine gases, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing silicon nitride selectively on an exposed silicon oxide surface of a substrate, the method comprising:

providing the substrate having the exposed silicon oxide surface and an exposed silicon surface;

exposing the substrate to transition metal-containing reactant to form an transition metal-containing moiety selectively on the exposed silicon oxide surface relative to the exposed silicon surface; and performing one or more cycles of thermal atomic layer deposition, each cycle comprising exposing the substrate to an aminosilane precursor and exposing the substrate to a hydrazine without igniting a plasma to form silicon nitride selectively on the exposed silicon oxide surface relative to the exposed silicon surface, wherein the hydrazine has a chemical structure of:

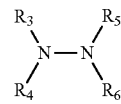

wherein R3, R4, R5, and R6 are each hydrogen or an alkyl group.

2. The method of claim 1, wherein the hydrazine is selected from the group consisting of t-butylhydrazine and tetramethyl hydrazine.

3. The method of claim 1, wherein the aminosilane precursor has a chemical formula

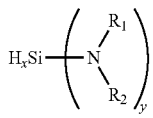

and wherein x is an integer between and including 1 and 3, x+y=4 and each of R1 and R2 is hydrogen or an alkyl group.

4. The method of claim 1, further comprising periodically exposing the substrate to the transition metal-containing reactant every 20 to 40 cycles of the thermal atomic layer deposition.

5. The method of claim 1, wherein the substrate is disposed in a chamber and chamber pressure during the exposing the substrate to the transition metal-containing reactant is the same as the chamber pressure during the one or more cycles of thermal atomic layer deposition.

6. The method of claim 1, wherein the substrate resides on a pedestal having the same temperature during the exposing the substrate to the transition metal-containing reactant as during the one or more cycles of thermal atomic layer deposition.

7. The method of claim 1, wherein the exposing the substrate to the transition metal-containing reactant is performed without igniting a plasma.

8. A method of depositing silicon nitride, the method comprising:
providing a substrate having a first exposed surface comprising hydroxyl end groups and a second exposed surface comprising Si—H bonds;
exposing the substrate to trimethylaluminum to form an aluminum-containing moiety selectively on the first exposed surface relative to the second exposed surface; and
performing one or more cycles of thermal atomic layer deposition, each cycle comprising exposing the substrate to an aminosilane precursor and exposing the substrate to a hydrazine without igniting a plasma to form silicon nitride selectively on the first exposed surface relative to the second exposed surface,
wherein the hydrazine has a chemical structure of:

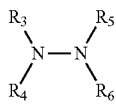

wherein R3, R4, R5, and R6 are each hydrogen or an alkyl group.

9. The method of claim 8, wherein the hydrazine is selected from the group consisting of t-butylhydrazine and tetramethyl hydrazine.

10. The method of claim 8, wherein the aminosilane precursor has a chemical formula

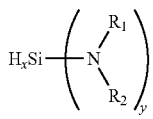

and wherein x is an integer between and including 1 and 3, x+y=4 and each of R1 and R2 is hydrogen or an alkyl group.

11. The method of claim 8, wherein the substrate is disposed in a chamber and chamber pressure during the exposing the substrate to the trimethylaluminum is the same as the chamber pressure during the one or more cycles of thermal atomic layer deposition.

12. The method of claim 8, wherein the substrate resides on a pedestal having the same temperature during the exposing the substrate to the trimethylaluminum as during the one or more cycles of thermal atomic layer deposition.

13. The method of claim 8, wherein the exposing the substrate to the trimethylaluminum is performed without igniting a plasma.

14. A method of depositing silicon nitride selectively on an exposed silicon oxide surface of a substrate, the method comprising:
providing the substrate having the exposed silicon oxide surface and an exposed silicon surface;
exposing the substrate to a non-hydride aluminum-containing gas to form an aluminum-containing moiety selectively on the exposed silicon oxide surface relative to the exposed silicon surface; and
performing one or more cycles of thermal atomic layer deposition, each cycle comprising exposing the substrate to an aminosilane precursor and exposing the substrate to a hydrazine without igniting a plasma to form silicon nitride selectively on the exposed silicon oxide surface relative to the exposed silicon surface,
wherein the hydrazine has a chemical structure of:

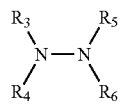

wherein R3, R4, R5, and R6 are each hydrogen or an alkyl group.

15. The method of claim 14, wherein the hydrazine is selected from the group consisting of t-butylhydrazine and tetramethyl hydrazine.

16. The method of claim 14, wherein the aminosilane precursor has a chemical formula

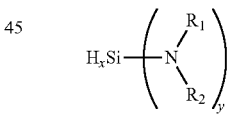

and wherein x is an integer between and including 1 and 3, x+y=4 and each of R1 and R2 is hydrogen or an alkyl group.

17. The method of claim 14, wherein the substrate is disposed in a chamber and chamber pressure during the exposing the substrate to the non-hydride aluminum-containing gas is the same as the chamber pressure during the one or more cycles of thermal atomic layer deposition.

18. The method of claim 14, wherein the substrate resides on a pedestal having the same temperature during the exposing the substrate to the non-hydride aluminum-containing gas as during the one or more cycles of thermal atomic layer deposition.

19. The method of claim 14, wherein the exposing the substrate to the non-hydride aluminum-containing gas is performed without igniting a plasma.

* * * * *